US006514336B1

(12) United States Patent
Zavartsev et al.

(10) Patent No.: US 6,514,336 B1
(45) Date of Patent: Feb. 4, 2003

(54) METHOD OF GROWING PIEZOELECTRIC LANTHANIDE GALLIUM CRYSTALS

(75) Inventors: Iouri D. Zavartsev, Richmond (CA); Serguei A. Koutovoi, Krasnodar (RU); Alexander I. Zagoumenny, Richmond (CA); Pavel A. Studenikin, Richmond (CA); A. Faouzi Zerrouk, Vancouver (CA); Damien G. Loveland, Richmond (CA)

(73) Assignee: Utar Scientific, Inc. (CA)

( * ) Notice: Subject to any disclaimer, the term of this patent is extended or adjusted under 35 U.S.C. 154(b) by 44 days.

(21) Appl. No.: 09/686,898

(22) Filed: Oct. 12, 2000

(51) Int. Cl.$^7$ .............................................. C30B 15/20
(52) U.S. Cl. ............................ 117/13; 117/23; 117/937
(58) Field of Search ............................. 117/13, 23, 937

(56) References Cited

U.S. PATENT DOCUMENTS

| 5,821,673 A | 10/1998 | Pisarevsky et al. |
| 5,917,265 A | 6/1999 | Naumenko et al. |
| 5,981,673 A | 11/1999 | DeSimone et al. |
| 6,097,131 A | 8/2000 | Naumenko et al. |

FOREIGN PATENT DOCUMENTS

| GB | 2328815 A | 3/1999 |
| JP | 1106294 A | 4/1999 |
| JP | 11199392 A | 7/1999 |
| JP | 11322495 A | 11/1999 |
| RU | 2108417 | 4/1998 |
| RU | 2108418 | 4/1998 |
| RU | 2126063 | 2/1999 |
| RU | 2126064 | 2/1999 |
| RU | 2143015 | 12/1999 |
| WO | WO 99/35739 | 7/1999 |
| WO | WO 99/61686 | 12/1999 |

OTHER PUBLICATIONS

"Some aspects of the macroscopic theory of oriented crystallization from the melt", E.A. Brener and V.A. Tatarchenko, Acta Physica Academiae Scientiarum Hungaricae, Tomus 47 (1–3), (1979), pp. 133–138.

"Capillary shaping in crystal growth from melts", V.A. Tatarchenko, Journal of Crystal Growth 37 (1977), pp. 272 and 274.

"Crystallization stability during capillary shaping", G.I. Babkin, E.A. Brener and V.A. Tatarchenko, Journal of Crystal Growth 50 (1980), pp. 45–50.

"Production of profiled single crystals and articles using the Stepanov method", P.I. Antonov, L.M. Zatulovskii, A.C. Kostyugov, (eds), Leningrad "Nauka" (1981), pp. 30 and 31.

(List continued on next page.)

*Primary Examiner*—Felisa Hiteshew
(74) *Attorney, Agent, or Firm*—Hall, Priddy, Myers & Vande Sande

(57) ABSTRACT

A method for producing piezoelectric lanthanide gallium crystals includes pulling a crystal through a forming mould dipped into a crucible containing a melt, which controls a heat and mass transfer, as the crystal is grown. While a lanthanide gallium single crystal is growing, a charge of mixed oxides, having a composition of the melt may be continuously added to the melt such that the quantity of melt is maintained substantially stable. Crystals produced by this method exhibit less variability in piezoelectric properties. The growth direction of the crystal is aligned along an axis perpendicular to such a crystallographic plane of lanthanide gallium crystal that an improved temperature stability, lowered power flow angle, and reduced diffraction would be present in surface acoustic wave (SAW) devices made in this crystallographic plane. Such crystals are more suitable for the mass-production slicing wafers, for example over 2 inches in diameter, for SAW devices.

31 Claims, 5 Drawing Sheets

OTHER PUBLICATIONS

"Investigation of trigonal $(La_{1-x}Nd_x)_3Ga_5SiO_{14}$ crystals", A.A. Kaminskii, B.V. Mill, G.G. Khodzhabagyan, A.F. Konstantinova, A.I. Okorochkov, and I.M. Silvestrova, Physics Status Solid (a) 80 (1983), pp. 387–398.

Czochralski growth and characterization of piezoelectric single crystals with langasite structure: $La_3Ga_5SiO_{14}$ (LGS), $La_3Ga_{5.5}Nb_{0.5}O_{14}$ (LGN), and. $La_3Ga_{5.5}Ta_{0.5}O_{14}$ (LGT), Part I., J. Bohm, R.B. Heimann, M. Hengst, R. Roewer, J. Schindler, Journal of Crystal Growth 204 (1999), pp. 128–136.

"Czochralski growth and characterization of piezoelectric single crystals with langasite structure: $La_3Ga_5SiO_{14}$ (LGS), $La_3Ga_{5.5}Nb_{0.5}O_{14}$ (LGN) and $La_3Ga_{5.5}Ta_{0.5}O_{14}$ (LGT), II. Piezoelectric and elastic properties", J. Bohm, E. Chilla,. C. Flannery, H.–J. Frohlich, T. Hauke, R.B. Heimann, M. Hengst, U. Straube, Journal of Crystal Growth 216 (2000), pp. 293–298.

"Czochralski growth of $RE_3Ga_5SiO_{14}$ (RE = La, Pr, Nd) single crystals for the analysis of the influence of rare earth susbstitution on piezoelectricity" J. Sato, H. Takeda, H. Morikoshi, K. Shimamura, P. Rudolph, T. Fukuda, Journal of Crystal Growth 191 (1998), pp. 746–753.

"Growth of a 3" langasite crystal with clear faceting", Satoshi Uda, Oleg Buzanov, Journal of Crystal Growth 211 (200), pp. 318–324.

"Growth and characterization of lanthanum gallium silicate $La_3Ga_5SiO_{14}$ single crystals for piezoelectric applications", Kiyoshi Shimamura, Hiroaki Takeda, Takuya Kohno, Tsuguo Fukuda, Journal of Crystal Growth 163 (1996), pp. 388–392.

"Growth of 3–inch Langasite Single Crystal and Its Application to Substrate for Surface Acoustic Wave Filters", Satoshi Uda, Akihiro Bungo, Chunyun Jian, Japan Journal Applied Physics vol. 38 (1999), pp. 5516–5519.

"Growth and characterization of $La_3Ta_{0.5}Ga_{5.5}O_{14}$ single crystals", Hiroyuki Kawanaka, Hiroaki Takeda, Kiyoshi Shimamura, Tsuguo Fukuda, Journal of Crystal Growth 183 (1998), pp. 274–277.

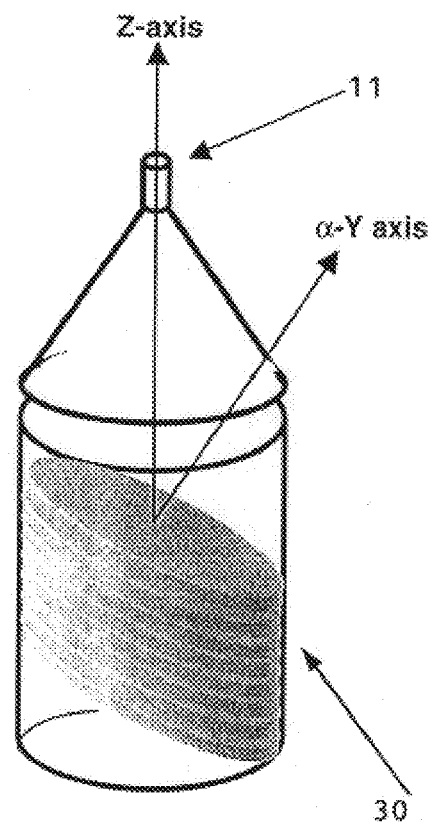
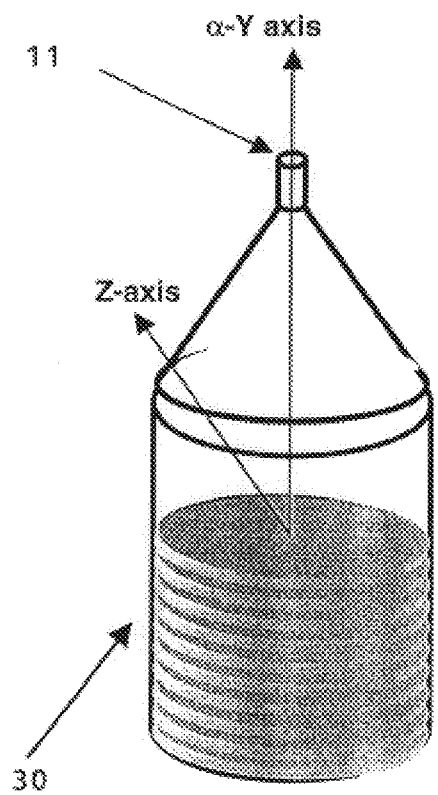
FIG. 2a
FIG. 2b

| Embodiment | Growth method | Composition | Presence of micro additions | Diameter of crucible, mm | Forming mould cross-section size, mm | Growth atmosphere | Pulling velocity mm/h | Rotation rate 1/min | Orientation of seed crystal | Cross-section of grown crystal, mm | Colour of grown crystal | Presence of macro-defects |
|---|---|---|---|---|---|---|---|---|---|---|---|---|
| 6 | Drawing from a melt FIG.1 | $La_{1.95}Ce_{0.05}Sr\ Nb_{0.75}Si_{0.5}Ga_{4.75}O_{14}$ | Ce Mo Ge | 100 | Ø 70 | Ar + 0.5vol% $O_2$ | 1.7 | 25 | $<10\bar{1}0>$ | Ø 69 | Pale yellow | No |
| 7 | Stepanov, FIG.3 | $La_{2.95}Nd_{0.01}Pb_{0.04}Ti\ Sb_{0.02}Ga_{4.98}O_{14}$ | No | 120 | 80 × 80 | Ar + 15 vol% $O_2$ | 1.4 | No | $<0001>$ | 76 × 76 | Dark red | No |
| 8 | Czochralski, FIG.1 | $La_{1.71}Pr_{0.09}Ca_{0.9}Si\ V\ Ga_{4.1}O_{14}$ | No | 120 | Ø 85 | Ar | 0.8 | 18 | $<0001>$ | Ø 75 | Colourless | No |
| 9 | CAST FIG.1 | $La_{1.568}Ba_{1.372}Ta_{0.63}In_{0.404}Si_{1.212}Ga_{3.838}O_{14.076}\ 0.01$ | Lu, Li, Al, Mo, W | 120 | 80 × 20 | $N_2$ + 10 vol% $CO_2$ | 1.5 | No | $<0001>$ | 78 × 18 | Dark red | No |
| 10 | EFG FIG.3 | $LaCa_2GeTaGa_4O_{13.99}F_{0.01}$ | No | 100 | 75 × 3 | $N_2$ + 0.1 vol% $F_2$ | 2.5 | No | $<11\bar{2}0>$ | 72 × 1 | Colourless | Scattering |
| 11 | Drawing from a melt FIG.1 | $La_{3.03}Ga_{5.555}Nb_{0.475}O_{14.065}$ | No | 150 | Ø 115 | Ar + 0.5vol% $O_2$ | 0.2 | 1 | $<11\bar{2}0>$ | Ø 114 | Pale yellow | Cracks |
| 12 | Stepanov, FIG.3 | $La_{2.1}Sr_{0.9}Si_{1.1}Sb_{0.4}Ga_{4.5}O_{13.994}\ 0.006$ | No | 100 | 70 × 70 | Ar + 1.5vol% $CO_2$ | 1.5 | 10 | $<10\bar{1}0>$ | Ø 70 | yellow | Voids |
| 13 | Czochralski, FIG.1 | $La_{2.97}Ga_{5.5275}Ta_{0.505}O_{14.009}$ | No | 150 | Ø 115 | $N_2$ | 0.2 | 2 | $<0001>$ | Ø 100 | Colourless | No |

FIG. 4A

| # Embodiment | Growth method | Composition | Presence of micro additions | Diameter of crucible, mm | Forming mould cross-section size, mm | Growth atmosphere | Pulling velocity mm/h | Rotation rate 1/min | Orientation of seed crystal | Cross-section of grown crystal, mm | Colour of grown crystal | Presence of macro-defects |
|---|---|---|---|---|---|---|---|---|---|---|---|---|
| 14 | Czochralski, FIG.1 | La$_{2.1}$Ca$_{0.9}$Nb$_{0.45}$Si$_{0.1}$Ga$_{5.25}$O$_{13.23}$F$_{0.02}$ | No | 120 | ⌀ 85 | Ar + 0.2 vol% F$_2$ | 1.0 | 12 | <0001> | ⌀ 75 | Colourless | No |
| 15 | Stepanov, FIG.3 | La$_{1.1}$Ba$_{1.9}$Ge$_{2.9}$Ga$_{3.1}$O$_{14}$ | No | 100 | 70 × 70 | Ar + 1.8 vol% O$_2$ | 3 | No | <0001> | 65 × 65 | Yellow | Scattering |
| 16 | Drawing from a melt FIG.1 | La$_{2.9}$Ga$_{4.75}$Si$_{1.2}$O$_{13.875}$ | No | 120 | ⌀ 85 | Ar + 0.8 vol% CO$_2$ | 0.8 | 5 | <10$\bar{1}$0> | ⌀ 82 | Pale yellow | No |
| 17 | CAST FIG.3 | La$_{2.45}$Ce$_{0.05}$Sr$_{0.5}$Zr$_{0.5}$Ga$_5$O$_{13.96}$ $_{0.04}$ | Mn Cr Tb Y | 100 | 75 × 12 | N$_2$ + 0.2 vol% O$_2$ | 3 | No | <11$\bar{2}$0> | 73 × 10 | Pale yellow | Cracks |
| 18 | EFG FIG.3 | La$_{2.99}$Nd$_{0.01}$Sc$_{0.5}$Nb$_{0.5}$Ga$_5$O$_{13.9}$F$_{0.1}$ | No | 100 | 75 × 3 | Ar + 1 vol% F$_2$ | 2.5 | No | <10$\bar{1}$0> | 72 × 1 | Colourless | Voids |
| 19 | Stepanov, FIG.3 | La$_2$Ca Sc Ge V Ga$_3$ O$_{13.9}$ | No | 120 | 80 × 80 | N$_2$ + 5 vol% CO$_2$ | 2.0 | 10 | <0001> | ⌀ 80 | Red | No |
| 20 | Czochralski, FIG.1 | La$_{2.95}$Pb$_{0.05}$Sn$_{1.95}$V$_{0.05}$Ga$_4$O$_{14.45}$F$_{0.05}$ | No | 150 | ⌀ 115 | Ar + 0.5 vol% F$_2$ | 0.2 | 8 | <0001> | 100 | Colourless | No |
| 21 | Drawing from a melt FIG.1 | La$_{2.95}$Ga$_{4.8}$Ti$_{1.1}$O$_{13.825}$ | No | 150 | ⌀ 115 | Ar + 15 vol% CO$_2$ | 0.1 | 3 | <11$\bar{2}$0> | 114 | Dark red | No |

FIG. 4B

METHOD OF GROWING PIEZOELECTRIC LANTHANIDE GALLIUM CRYSTALS

FIELD

The present invention relates to a method of growing large diameter piezoelectric $Ln_3Ga_{5.5}Me_{0.5}O_{14}$ (Ln=La, Pr, Nd and Me=Nb,Ta) and $Ln_3Ga_5M'O_{14}$ (Ln=La, Pr, Nd M'=Si, Ti, Zr, Hf) single crystals and solid solutions on this basis and more particularly to a method of growing such crystals for use as wafers in bulk acoustic wave (BAW), surface acoustic wave (SAW), and pseudo surface acoustic wave (PSAW) devices, having an excellent temperature characteristic and a large electromechanical coupling factor. The SAW devices are currently used, for example, as bandpass filters, resonators, delay lines and converters, in a broad range of wireless applications, cellular communication devices and cable TV.

DESCRIPTION OF THE PRIOR ART

Piezoelectric material based on lanthanide gallium crystals, including the langasite family of crystals, i.e. $La_3Ga_3SiO_{14}$, referred to as langasite (LGS), $La_3Ga_{5.5}Nb_{0.5}O_{14}$, referred to as langanite (LGN), and langatate $La_3Ga_{5.5}Ta_{0.5}O_{14}$ (LGT) are known to be useful for piezoelectric applications. A SAW device having a LGS single crystal substrate is disclosed in U.S. Pat. No. 5,821,673, U.K. Pat. No 2,328,815, RU Pat. No 2073952, and U.S. Pat. No. 5,917,265. A LGT single crystal substrate having a prescribed range of Euler angles for substrate and crystal orientation to improve signal processing in a SAWdevice, is disclosed in U.S. Pat. No. 6,097,131.

A SAW device comprising a wafer constructed of a trigonal langasite crystal cut at predominated cut angles is disclosed in U.S. Pat. No. 5,981,673. An optimal cut for SAW devices made from langatate crystals is disclosed in U.S. Pat. No. 6,097,131. A substrate for piezoelectric device and SAW devices composed of a single crystal of langanite is proposed in JP Pat. No 11106294A.

The method of oriented crystallization from a melt, eliminating any contact with the side faces of a growing crystal with solid walls, are now well known and increasingly becoming widespread. These are the Czochralski (conventional Czochralski), Stepanov, Verneuil and floating zone techniques, characterized by a fixed orientation of crystallization at a fixed position of the solid—liquid interface. Each of these techniques has a predominant field of application with the common feature of the elimination of contact between the crystal and a solid wall. As a result, both the shape and the size of a growing crystal are essentially determined by capillary forces, which form a meniscus in the interface boundary zone. In addition, the crystallization process also depends on the conditions of heat and mass exchange in the crystal-melt system, which is generally described in the publication "Some aspects of the macroscopic theory of oriented crystallization from the melt", E. A. Brener and V. A. Tatarchenko, Acta Physica Academias scientiarum Hungaricas, 47 (1–3) (1979) 133–138. A Stepanov crystal growth method based on a capillary formed pole of melt by means of a special mould and the crystallization of the pole outside the container is generally described in "Capillary shaping in crystal growth from melts" V. A. Tatarchenko, Journal of Crystal Growth 37 (1977) 272–284 and "Crystallization stability during capillary shaping" G, I. Babkin, E. A. Brener and V. A. Tatarchenko, Journal Crystal Growth 50 (1980) 45–50.

Another crystal growth method, the EFG crystal growth method, is a method of profiled crystal growth or a method of edge defined film fed growth. The capillary action shaping technique, CAST differs from the EFG technique in the construction of the forming mould and a presence of forced inert gas cooling. The Stepanov, EFG and CAST methods are described in the publication "Growth the profiled single crystals by Stepanov technique" P. I. Antonov, L. M. Zatulovskii, A. C. Kostyugov, (eds) Leningrad "Nauka" (1981) 280 pp.

The method proposed for growing a piezoelectric material based on lanthanide gallium crystals is the conventional Czochralski crystal growth method. The growth of the langasite family of crystals by the Czochralski method is accurately described in "Investigation of trigonal $(La_{1-x}Nd_x)_3Ga_2SiO_{14}$ crystals" A. A. Kaminskii, B. V. Mill, G. G. Khodzhabagyan, A. F. Konstantinova, A. I. Okorochkov, and I. M. Silvestrova, Physics Status Solid (A) 80 (1983) 387–398 and "Czochralski growth and characterization of piezoelectric single crystals with langasite structure: $La_3Ga_5SiO_{14}$ (LGS), $La_3Ga_{5.5}Nb_{0.5}O_{14}$ (LGN) and $La_3Ga_{5.5}Ta_{0.5}O_{14}$ (LGT), Part I." J. Bohm, R. B. Heimann, M. Hengst, R. Roewer, J. Schindler, Journal of Crystal Growth 204 (1999) 128–136 and "Czochralski growth and characterization of piezoelectric single crystals with langasite structure: $La_3Ga_5SiO_{14}$ (LGS), $La_3Ga_{5.5}Nb_{0.5}O_{14}$ (LGN) and $La_3Ga_{5.5}Ta_{0.5}O_{14}$ (LGT), Part II. Piezoelectric and elastic propeties" J. Bohm, E. Chilla, C. Flannery, H.-J. Frohlich, T. Hauke, R. B. Heimann, M. Hengst, U. Strauber, J. Schindler, Journal of Crystal Growth 216 (2000) 293–298. The Czochralski growth method of solid solutions of piezoelectric lanthanum gallium silicate single crystals is presented in the publication "Czochralski growth of $RE_3Ga_5SiO_{14}$ (RE=La, Pr, Nd) single crystals for the analysis of the influence of rare earth substitution on piezoelectricity" J. Sato, H. Takeda, H. Morikoshi, K. Shimamura, P. Rudolph, T. Fukuda, Journal Crystal Growth 191 (1998) 746–753.

The successful growth of 1 or 2 inch diameter and 130 mm length $La_3Ga_5SiO_{14}$ single crystal using the conventional Czochralski technique is described in "Growth and characterization of lanthanum gallium silicate $La_3Ga_5SiO_{14}$ single crystals for piezoelectric applications" Kiyoshi Shimamura, Hiroaki Takeda, Tsuguo Fukuda, Journal of Crystal Growth 163 (1996) 388–392. The Czochralski method for growth of a langasite crystal of 3-inch diameter with a 90 mm length cylindrical part along the Z-axis is described in the publications "Growth of a 3" langasite crystal with clear faceting" Satoshi Uda, O. Buzanov, Journal of Crystal Growth, 211 (2000) p. 318–324, "Growth of 3-inch langasite single crystal and its application to substrate for surface acoustic wave filters", Satoshi Uda, Akihiro Bungo, Chunyun Jian, Japan Journal Applied Physics, 38 (1999) 5516–5519. Growth of langatate $La_3Ta_{0.5}Ga_{5.5}O_{14}$ crystals by the Czochralski method is described in "Growth and characterization of $La_3Ta_{0.5}Ga_{5.5}O_{14}$ single crystals" Hiroyuki Kawanaka, Hiroaki Takeda, Kiyoshi Shimamura, Tsuguo Fukuda, Journal of Crystal Growth 183 (1998) 274–277.

A method of growing single crystals of lanthanum-gallium silicate is disclosed in RU Pat. No 2126064, RU Pat. No 2143015, RU Pat. No 2126063, RU Pat. No 2108417, RU Pat. No 2108418, and W.O. Pat. No 9961686A1. The essence of the method consists in the selection of the orientation of the seed crystal ensuring growth by the Czochralski method of single crystals of lanthanum-gallium silicate along the directions <01.1>, <02.1>, <02.3>, <03.2> or at 54 degrees to the "Y" axis. A method of growing of lanthanum gallium tantalum single crystal (LGT) is disclosed in JP Pat. No 11322495A and JP Pat. No 11199392A in which langatate crystals are doped with Pr, Nd, Ce, Sm and Eu impurities are grown by the Czochralski method.

While these methods can be used to make piezoelectric crystals, which are useful in certain applications, there is a variability of the piezoelectric behavior of different wafers cut from the same boule of lanthanide gallium crystal. The growth of langasite is characterized by distinct faceting along the (0001), (01$\bar{1}$0) and (01$\bar{1}$1) planes. Facet growth requires a greater supercooling than growth with a rough surface and hence the interface advances periodically rather than continuously.

Further, greater supercooling often leads to the presence of secondary or polycrystalline phases, resulting in scattering and/or cracking which is another problem of the conventional Czochralski method.

According to all the above-mentioned methods of growth, the lanthanide gallium melt needs to be held (soaked) at a certain temperature for a considerable time (4–20 hours). An appropriate thermal treatment of the melt is needed in order to obtain stable physical properties, which then permits further precise control of the melt temperature. An associated problem is the duration of the growth process and therefore its cost increases by up to 30%.

As described above, a bulk piezoelectric lanthanum gallium single crystal of good quality cannot presently be obtained with a high yield using a conventional Czochralski method.

It is an object of the present invention to provide a method for producing material, based on the lanthanide gallium crystals for use as piezoelectric, which displays substantially uniform piezoelectric properties throughout the crystal, a reproducibility of properties, a high yield, and resulting in a low manufacturing cost of BAW and SAW devices.

It is another object of the present invention to provide an improved Czochralski crystal growth method for producing piezoelectric material based on the lanthanide gallium crystals.

SUMMARY OF THE INVENTION

To overcome the problems described above, the present invention provides a method for producing lanthanide gallium crystals in which, to control heat and mass transfer and to maintain a steady state of crystal melt interface, the growing crystal is pulled through a forming mould dipped into the melt contained in a crucible. While a lanthanide gallium single crystal is growing, a mixed oxide charge of the same composition as the melt may be continuously added to the melt such that the quantity of melt is maintained substantially stable. Crystals produced by this method exhibit less variability in piezoelectric properties.

The shape of the solid-liquid interface is determined by the shape of the freezing isotherm. Consequently, the objects of the invention are achieved by controlling the shape of the freezing isotherm during the main part of the crystal growth. There may be some variation from the desired conditions at the beginning and the end of the growth. The thermal conditions are determined by the crucible and forming mould sizes and their location in the heating environment as well as the furnace design and the insulating material employed.

The preferred embodiments of the present invention also provide an optimal growth direction for the crystal aligned with axis perpendicular to such a crystallographic plane of lanthanide gallium crystal that an improved temperature stability, lower power flow angle, and reduced diffraction are present in a SAW device cut in this plane. Consequently, the other objects of the invention are achieved by choosing an optimum growth direction for piezoelectric applications independently of the crystallization rate. Optimal orientation allows the cutting of wafers at an angle of 90 degrees to growth axis to ensure minimal losses of material. This also means that the temperature coefficient of frequency in the wafer is close to zero. The optimally oriented lanthanum gallium crystals which are grown are more suitable for the mass-production slicing of crystals into wafers for SAW devices, suitable sizes of which may be 2 inches or more in diameter.

BRIEF DESCRIPTION OF THE DRAWINGS

The foregoing summary, as well as the following detailed description of the preferred embodiments of the invention, will be better understood when read in conjunction with the appended drawings. For the purpose of illustrating the invention there is shown in the drawings embodiments which are presently preferred. It should be understood, however, that the present invention is not limited to the particular arrangements and instrumentalities shown. In the drawings:

FIG. 2a is a schematic showing the seed crystal oriented along the crystallographic z-axis and the optimally oriented wafers cut from grown boule;

FIG. 2b is a schematic showing the seed crystal oriented at a degrees to the "Y" axis and the optimally oriented wafers cut from grown boule;

FIGS. 4a and 4b are tables of the results of growing crystals using various compositions and the parameters used in the growing operation.

DESCRIPTION OF THE PREFERRED EMBODIMENTS OF THE INVENTION

While this invention can have many different embodiments, the drawings and description will detail several specific embodiments. It should be understood, however, that the present disclosure is to be considered as exemplification of the principles of the invention and is not intended to limit the invention to any specific embodiment.

Figure 1:
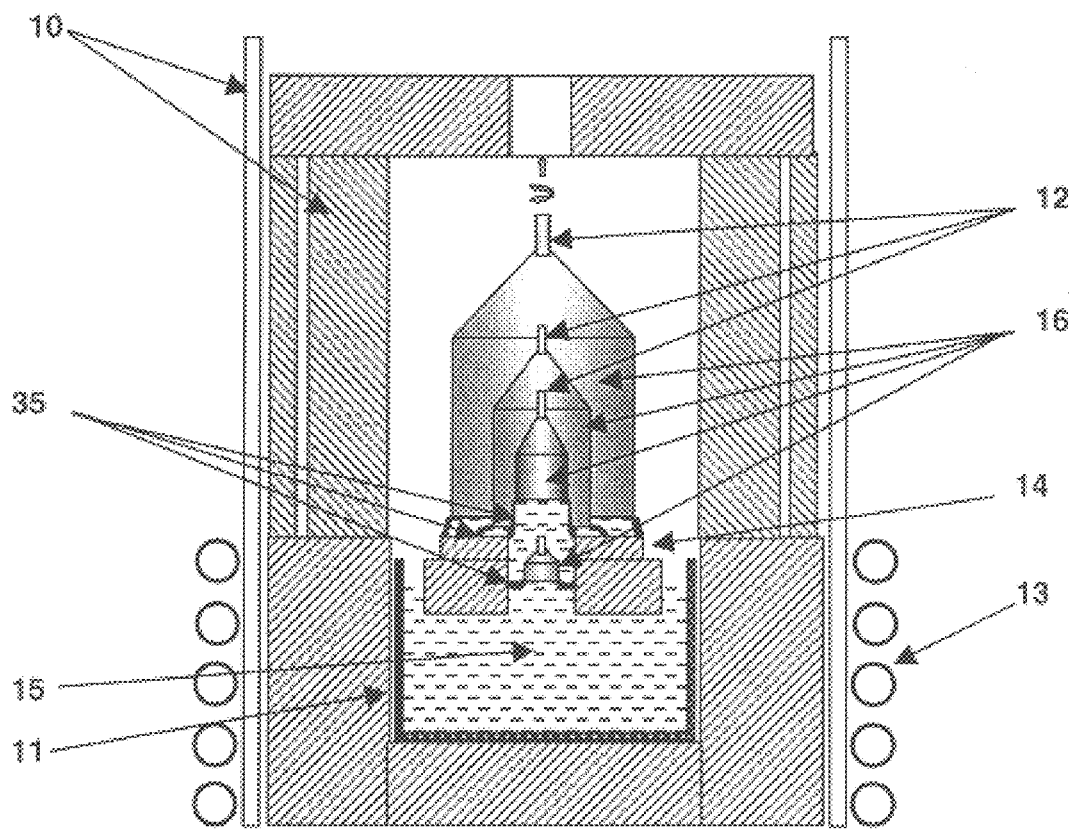
FIG. 1 shows a schematic view of the different furnaces used to produce different sizes of piezoelectric lanthanum gallium single crystals.

Crystal growth is accomplished with a crystal grower machine (Kristall-3M) which includes a furnace as shown in FIG. 1. The furnace comprises a housing 10 formed from refractory and insulating materials and having a crucible 11 located therein. The crucible 11 holds a forming mould 14 dipped into a melt 15. The housing includes an aperture for insertion of a seed crystal 12. An RF inductive heating coil 13 surrounds the housing 10 at the level of the crucible 11.

In general the class of piezoelectric lanthanum gallium crystals covered by this invention can be described by the following chemical formulae:

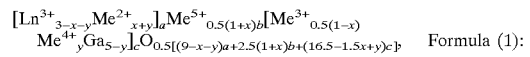

$$[Ln^{3+}_{3-x-y}Me^{2+}_{x+y}]_a Me^{5+}_{0.5(1+x)b}[Me^{3+}_{0.5(1-x)}Me^{4+}_{y}Ga_{5-y}]_c O_{0.5[(9-x-y)a+2.5(1+x)b+(16.5-1.5x+y)c]}\text{,} \quad \text{Formula (1):}$$

where $Ln^{3+}$ is at least one of the elements selected from the group consisting of La, Ce, Pr, and Nd; $Me^{2+}$ is at least one of the elements selected from the group consisting of Ca, Sr, Ba, and Pb; $Me^{3+}$ is at least one of the elements selected from the group consisting of Ga, Sc, and In; $Me^{4+}$ is at least one of the elements selected from the group consisting of Si and Ge; $Me^{5+}$ is at least one of the elements selected from the group consisting of Nb, Ta, Sb, and V; x is a value not exceeding one; y is a value not exceeding (2−x); 0.92<a<1.07; 0.9<b<1.1; and 0.99<c<1.02

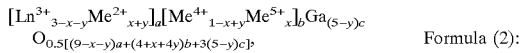

Formula (2):

where $Ln^{3+}$ is at least one of the elements selected from the group consisting of La, Ce, Pr, and Nd; $Me^{2+}$ is at least one of the elements selected from the group consisting of Ca, Sr, Ba, and Pb; $Me^{4+}$ is at least one of the elements selected from the group consisting of Ti, Zr, Hf, Sn, Ce, Pr, Si and Ge; $Me^{5+}$ is at least one of the elements selected from the group consisting of Nb, Ta, Sb, and V; x is a value not exceeding one; y is a value not exceeding (2−x); 0.86<a<1.1; 0.85<b<1.3; and 0.94<c<1.08

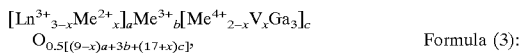

Formula (3):

where $Ln^{3+}$ is at least one of the elements selected from the group consisting of La, Ce, Pr, and Nd; $Me^{2+}$ is at least one of the elements selected from the group consisting of Ca, Sr, Ba, and Pb; $Me^{3+}$ is at least one of the elements selected from the group consisting of Ga, Sc, and In; $Me^{4+}$ is at least one of the elements selected from the group consisting of Si, Ge, and Sn; x is a value not exceeding two; 0.86<a<1.1; 0.85<b<1.3; and 0.94<c<1.08

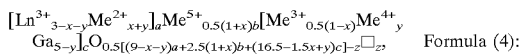

Formula (4):

where $Ln^{3+}$ is at least one of the elements selected from the group consisting of La, Ce, Pr, and Nd; $Me^{2+}$ is at least one of the elements selected from the group consisting of Ca, Sr, Ba, and Pb; $Me^{3+}$ is at least one of the elements selected from the group consisting of Ga, Sc, and In; $Me^{4+}$ is at least one of the elements selected from the group consisting of Si and Ge; $Me^{5+}$ is at least one of the elements selected from the group consisting of Nb, Ta, Sb, and V; □ represents oxygen vacancies of quantity z not exceeding 0.2 formula units; x is a value not exceeding one; y is a value not exceeding (2−x); 0.92<a<1.07; 0.9<b<1.1; and 0.99<c<1.02

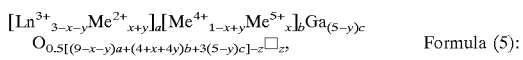

Formula (5):

where $Ln^{3+}$ is at least one of the elements selected from the group consisting of La, Ce, Pr, and Nd; $Me^{2+}$ is at least one of the elements selected from the group consisting of Ca, Sr, Ba, and Pb; $Me^{4+}$ is at least one of the elements selected from the group consisting of Ti, Zr, Hf, Sn, Ce, Pr, Si and Ge; $Me^{5+}$ is at least one of the elements selected from the group consisting of Nb, Ta, Sb, and V; □ represents oxygen vacancies of quantity z not exceeding 0.2 formula units; x is a value not exceeding one; y is a value not exceeding (2−x); 0.86<a<1.1; 0.85<b<1.3; and 0.94<c<1.08

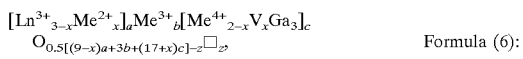

Formula (6):

where $Ln^{3+}$ is at least one of the elements selected from the group consisting of La, Ce, Pr, and Nd; $Me^{2+}$ is at least one of the elements selected from the group consisting of Ca, Sr, Ba, and Pb; $Me^{3+}$ is at least one of the elements selected from the group consisting of Ga, Sc, and In; $Me^{4+}$ is at least one of the elements selected from the group consisting of Si, Ge, and Sn; □ represents oxygen vacancies of quantity z not exceeding 0.2 formula units; x is a value not exceeding two; 0.86<a<1.1; 0.85<b<1.3; and 0.94<c<1.08

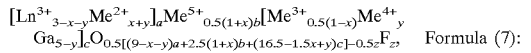

Formula (7):

where $Ln^{3+}$ is at least one of the elements selected from the group consisting of La, Ce, Pr, and Nd; $Me^{2+}$ is at least one of the elements selected from the group consisting of Ca, Sr, Ba, and Pb; $Me^{3+}$ is at least one of the elements selected from the group consisting of Ga, Sc, and In; $Me^{4+}$ is at least one of the elements selected from the group consisting of Si and Ge; $Me^{5+}$ is at least one of the elements selected from the group consisting of Nb, Ta, Sb, and V; $F_z$ is fluorine of quantity z not exceeding 0.2 formula units; x is a value not exceeding one; y is a value not exceeding (2−x); 0.92<a<1.07; 0.9<b<1.1; and 0.99<c<1.02.

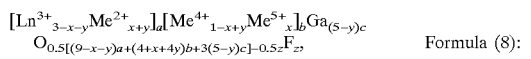

Formula (8):

where $Ln^{3+}$ is at least one of the elements selected from the group consisting of La, Ce, Pr, and Nd; $Me^{4+}$ is at least one of the elements selected from the group consisting of Ca, Sr, Ba, and Pb; $Me^{4+}$ is at least one of the elements selected from the group consisting of Ti, Zr, Hf, Sn, Ce, Pr, Si and Ge; $Me^{5+}$ is at least one of the elements selected from the group consisting of Nb, Ta, Sb, and V; $F_z$ is fluorine of quantity z not exceeding 0.2 formula units; x is a value not exceeding unit, y is a value not exceeding (2−x); 0.86<a<1.1; 0.85<b<1.3; and 0.94<c<1.08.

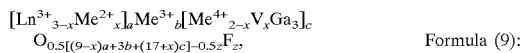

Formula (9):

where $Ln^{3+}$ is at least one of the elements selected from the group consisting of La, Ce, Pr, and Nd; $Me^{2+}$ is at least one of the elements selected from the group consisting of Ca, Sr, Ba, and Pb; $Me^{3+}$ is at least one of the elements selected from the group consisting of Ga, Sc, and In; $Me^{4+}$ is at least one of the elements selected from the group consisting of Si, Ge, and Sn; $F_z$ is fluorine of quantity z not exceeding 0.2 formula units; x is a value not exceeding two; 0.86<a<1.1; 0.85<b<1.3; and 0.94<c<1.08.

In use, the raw oxide powder materials mentioned in formulae (1)–(9) are dried at 1000° C. then mixed in the appropriate proportions and pressed into pellets (where appropriate), and loaded into the crucible. The materials are then melted and the melt 15 may be doped with the oxides of micro additions of the chemical elements Li, Be, B, Na, Mg, Al, P, K, Ca, Sc, Ti, V, Cr, Mn, Fe, Co, Ni, Cu, Zn, Ge, As, Se, Rb, Sr, Y, Mo, Ru, Rh, Pd, Ag, Cd, In, Sn, Sb, Cs, Ba, Ce, Sm, Eu, Gd, Tb, Dy, Ho, Er, Tm, Yb, Lu, Hf, Ta, W, Re, Os, Ir, Pt, Au, Hg, Tl, Pb, Bi, U, Th at a quantity between $1 \times 10^{17}$ atom/cm$^3$ and $5 \times 10^{19}$ atom/cm$^3$.

The seed crystal 12 may be arbitrary orientated, including orientation coinciding with the Z-axis (see FIG. 2a) or orientation aligned with the α-Y axis perpendicular to a crystallographic plane of lanthanum gallium crystal (FIG. 2b). Crystals sliced along the crystallographic plane have an optimized combination of a minimal power flow angle, a minimal temperature coefficient of frequency, negligible diffraction, and high electromechanical coupling factor. With an α-Y axis orientation it is possible to cut wafers 30 at an angle of 90 degrees to the growth axis to ensure minimal losses of material and a crystal temperature coefficient of frequency close to zero.

The seed crystal 12, oriented at α degrees to the "Y" axis or having another optimal orientation or an arbitrary orientation, is brought in contact with the surface of the melt 15. Using the seed crystal 12 the growing crystal 16 is drawn from the melt 15 through the forming mould 14 dipped in the melt 15. The forming moulds 14 are fixed independently of the crucible 11 to facilitate mould replacement and prevent deformation on the melt 15 solidification. The forming mould is set in crucible 11 to control heat and mass transfer and to maintain a steady state of the crystal melt interface. The main task to solve is the creation of a temperature distribution near the solid-liquid interface such that the profile of isotherms in the melt 15 define geometrical form of the pulling crystal. The forming mould 14 has an arbitrary cross-sectional form including round or square, and a height less than the crucible 11 height. Different constructions of forming moulds 14 used in Stepanov's, EFG and CAST crystal growth methods are presented in FIG. 3. The single-capillary 31, double-capillary 32, and multi-capillary 33 forming mould designs are presented as examples. The capillary moulds for types 31 and 32 comprise two or more parallel vertical plates 38 of equal length and 1 mm thickness, with a 1 mm-space to provide the capillary action. The multi-capillary moulds 33 have from 20 to 120 channels with 0.1 mm deep grooves on the surface of the plates. While the crystal is drawn through a forming mould the melt 15 moves up in capillary channels 34 under action of surface tension forces as a result of wetting 35 of the walls.

The crystals are grown in an argon atmosphere, in a mixture of argon and oxygen (the content of oxygen is up to 20 vol %), in a mixture of argon and carbon dioxide (the content of carbon dioxide is up to 20 vol %), in a mixture of argon and fluorine (the content of fluorine is up to 3 vol %), in a nitrogen atmosphere, in a mixture of nitrogen and oxygen (the content of oxygen is up to 20 vol %), or in a mixture of nitrogen and fluorine (the content of fluorine is up to 3 vol %). The crystals grown varied from colourless, through pale yellow and dark orange, to oxblood red in colour, depending on the oxygen content in the atmosphere in the growth chamber. A high oxygen content (approximately 8–20 vol % of oxygen) yields the oxblood red colour, whereas an oxygen content of about 2–8 vol % yields the darker orange colour. The crystals grown in an oxygen free atmosphere were colourless. This shading colour is caused by oxygen vacancies formed, the quantity of which depends on the amount of oxygen in the growth atmosphere.

The crystal is drawn through a forming mould when the pulling speed is in the range 0.1 mm per hour–3 mm per hour.

The crystal growth is actualized both with and without rotation of the seed crystal. When the crystal is grown from the melt 15 without rotation, its cross-section is determined by the shape of the melt column, because the cross-section of the pulled crystal 16 is determined by inter-section of the melt column and the melt-crystal interface 36. A crystal 16 has an approximately round cross-section profile when it is pulled from a melt 15 with rotation. The rotation rate may be varied between 1 and 30 revolutions per minute.

An increased amount of crystal and a reduced quantity of melt in the crucible alters the thermal conditions in the melt-crystal interface 36. This alteration may result in interface instability, and degradation of crystal quality. To maintain a quantity and a substantially stable level of melt 15 in crucible 11 a mixed oxide charge having a composition of the melt 15 is continuously added to the melt 15 while a crystal 16 is drawn from the melt 15.

After growth, annealing and cooling of the crystal is accomplished at an average rate of 10–40° C./hour.

Specific examples of crystal growth to which the present invention is applied will be described below but the present invention is not limited to the specific examples.

EMBODIMENT 1

A single crystal of $La_3Ga_{5.5}Nb_{0.5}O_{14}$, was grown by a drawing seed crystal 12 from a melt 15 through a dipped forming mould 14 as shown in FIG. 1.

The starting materials were prepared by drying and mixing 99.999% pure $La_2O_3$, $Ga_2O_3$, and $Nb_2O_5$ powders in a stoichiometric ratio, pressing, and then melting in several steps in a cylindrical iridium crucible 11 of 150 mm diameter and 150 mm height with a wall thickness 2.0 mm. Mounted in the thermal unit 10 of the CRYSTAL-3M growth machine, the iridium crucible 11 containing a 120-mm diameter forming mould was heated by a conventional RF heating method. Growth was performed in an atmosphere of mixed argon and oxygen the oxygen content of which was 1.5 vol %. The revolving seed crystal 12 oriented at 54 deg to the "Y" axis was brought in contact with the surface of melt 15 at a frequency of rotation of 3–18 1/minute. The crystal growth process continued until the solidified fraction g was approximately 0.48. The pulling rate was 0.5 mm/hour. After-growth annealing of the 100-mm diameter crystal was performed at average rate of cooling of 25° C./hour. The grown crystal was an ochre color. The method ensures growing of high-quality crystals which may be used for manufacture of crystal elements of SAW filters. The cutting of the grown langanite boule is effected perpendicularly relative to axis of growth, thus reducing the cost of crystal wafers and thus enhancing efficiency.

EMBODIMENT 2

A single crystal of $La_3Ga_5SiO_{14}$, was grown by drawing a seed crystal 12 from a melt 15 through a dipped forming mould 14 as shown in FIG. 1.

The starting materials were prepared by drying, mixing 99.999% pure $La_2O_3$, $Ga_2O_3$, and $SiO_2$ powders in a stoichiometric ratio, pressing, and then melting these powders in several steps in a cylindrical iridium crucible 11 having 120 mm in diameter and 120 mm in height with a wall thickness 2.0 mm. Mounted in the thermal unit 10 of the CRYSTAL-3M growth machine the iridium crucible 11 containing a 90-mm diameter forming mould was heated by a conventional RF heating method. Growth was performed in an argon atmosphere. The revolving seed crystal 12 oriented at 54 deg to the "Y" axis was brought in contact with the surface of the melt 15 at a frequency of rotation of 3–18 1/minute. The crystal growth process was continued until the solidified fraction g was approximately 0.7. The pulling rate was 0.7 mm/hour. After-growth annealing of the 83-mm diameter crystal was performed at average rate of cooling of 35° C./hour. The grown crystal was a colorless. The method ensures growing high-quality crystals which may be used for manufacture of crystal elements of SAW filters. The cutting of the grown langasite boule is effected perpendicularly relative to axis of growth, thus reducing the cost of crystal wafers and thus enhancing efficiency.

EMBODIMENT 3

Figure 3:
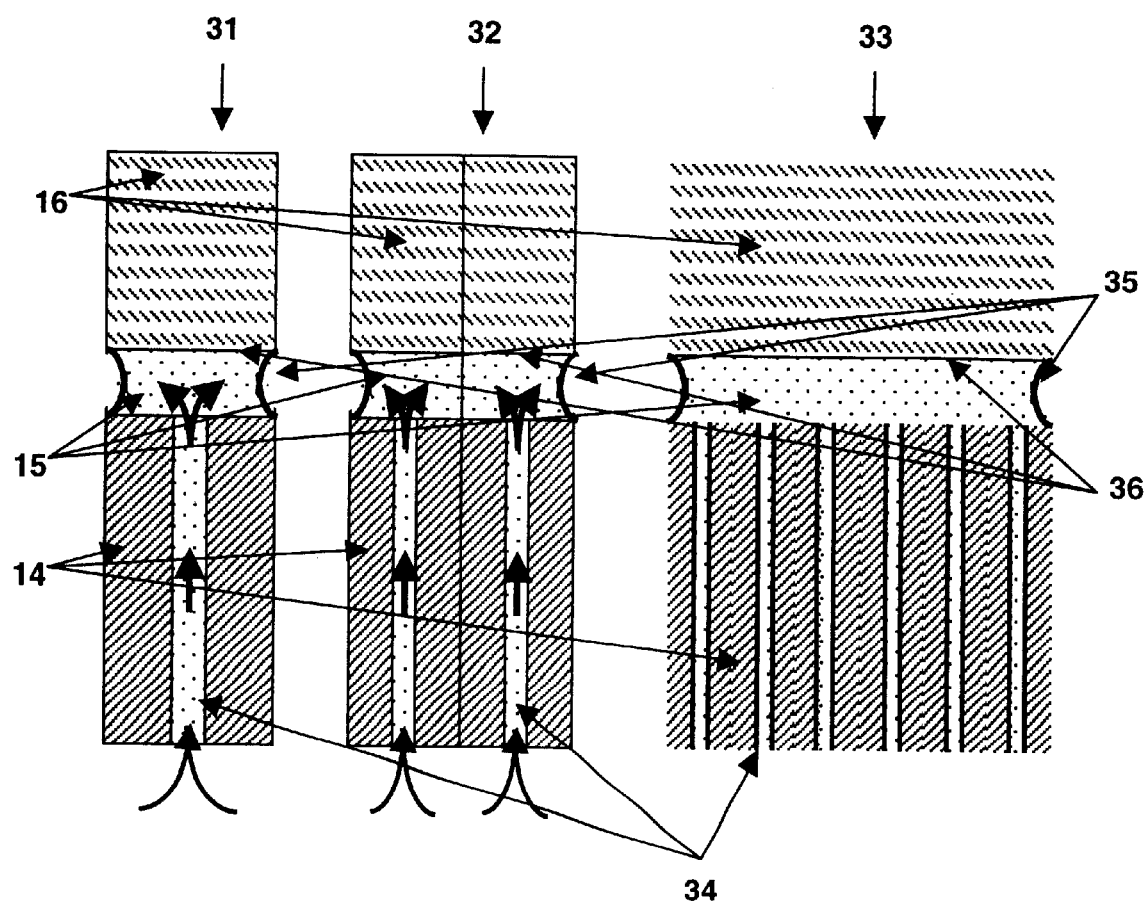
FIG. 3 shows the different constructions of forming moulds.

A single crystal of $La_3Ga_{5.5}Ta_{0.5}O_{14}$, was grown by drawing a seed crystal 12 from a melt 15 through a dipped forming mould 14 as shown in FIG. 3.

The starting materials were prepared by drying and mixing 99.999% pure $La_2O_3$, $Ga_2O_3$, and $Ta_2O_5$ powders in a stoichiometric ratio, pressing, and then melting these powders in several steps in a cylindrical iridium crucible 11 having 120 mm diameter and 120 mm height with a wall thickness 2.0 mm. Mounted in the thermal unit 10 of the CRYSTAL-3M growth machine the iridium crucible 11 containing a 88-mm×88-mm forming mould was heated by a conventional RF heating method. Growth was performed in a mixture of nitrogen and oxygen (the content of oxygen is up to 20 vol %). The revolving seed crystal 12 oriented along the crystallographic Z-axis was brought in contact with the surface of the melt 15 at frequency of rotation of 1–7 1/minute. The crystal growth process was continued until the solidified fraction g was approximately 0.6. The pulling rate was 0.7 mm/hour. After-growth annealing of the 80-mm diameter crystal was performed at an average rate of cooling of 35° C./hour. The grown crystal was a dark red color. The method ensures growing high-quality crystals which may be used for the manufacture of crystal elements of SAW filters.

EMBODIMENT 4

A single crystal of $La_{2.995}Ca_{0.005}Si_{0.995}Ta_{0.005}Ga_5O_{13.9}\square_{0.1}$ was grown by seed crystal 12 from a melt 15 through a dipped forming mould 14 as shown in FIG. 3.

The starting materials were prepared by drying and mixing 99.999% pure oxide powders of lanthanum, gallium, silicon, calcium and tantalum. The pressed mixture was melted in several steps in a cylindrical iridium crucible 11 100 mm in diameter and 100 mm in height with a wall thickness 2.0 mm. To produce oxygen vacancies in the quantity of 0.1 formula units the metallic gallium in the preset range of concentration was added to the melt. Mounted in the thermal unit 10 of the CRYSTAL-3M growth machine the iridium crucible 11 containing a 75-mm×75-mm forming mould was heated by a conventional RF heating method. Growth was performed in an argon atmosphere. A seed crystal 12 oriented along the crystallographic Z-axis was brought into contact with the surface of melt 15 without rotation of the crystal holder. The pulling rate was 1 mm/hour. The crystal growth process was continued until the solidified fraction g was approximately 0.45. After-growth annealing of 75-mm×75-mm crosssection crystal was performed at average rate of cooling of 30° C./hour. The grown crystal was colorless. The method ensures the growing of high-quality crystals which may be used for manufacture of crystal elements for surface acoustic wave filters.

EMBODIMENT 5

A single crystal of $La_{2.5}Ba^{2+}_{0.5}ScGe_{1.5}V_{0.5}Ga_3O_{13.975}F_{0.5}$ was grown by drawing a seed crystal 12 from a melt 15 through a dipped forming mould 14 as shown in FIG. 3.

The starting materials were prepared by drying and mixing 99.999% pure oxide powders of lanthanum, gallium, barium, scandium, germanium and vanadium in the preset range of concentration. The pressed mixture was melted in several steps in a cylindrical iridium crucible 11 having 100 mm diameter and 100 mm height with a wall thickness 2.0 mm. Mounted in thermal unit 10 of the CRYSTAL-3M growth machine the iridium crucible 11 containing a 75-mm×75-mm forming mould was heated by a conventional RF heating method. Growth was performed in a mixture of argon and fluorine (the content of fluorine was 0.5 vol %). The revolving seed crystal 12 oriented at 54 deg to the "Y" axis was brought into contact with the surface of the melt 15 at frequency of rotation of 2–11 1/minute. The pulling rate was 1.2 mm/hour. The crystal growth process was continued until the solidified fraction g was approximately 0.5. After-growth annealing of the 75-mm diameter crystal was performed at an average rate of cooling of 30° C./hour. The grown crystal was colorless. The method ensures growing high-quality crystals which may be used for manufacture of crystal elements for surface acoustic wave filters.

Further results of growing with still different technological parameters are presented in FIGS. 4a and 4b.

Thus, it will be appreciated that various modifications, alternatives, variations, etc., may be made without departing from the spirit and scope of the invention as defined in the appended claims. it is, of course, intended to cover by the appended claims all such modifications as fall within the scope of the claims.

We claim:

1. A method of growing piezoelectric lanthanide gallium crystals comprising:
   forming a lanthanide-gallium melt;
   drawing a crystal of preselected crystallographic orientation from said melt while the growing crystal is pulled through a dipped forming mould in order to control a heat and mass transfer and to maintain a crystal melt interface in a steady state.

2. The method of claim 1, including continuously adding to the melt a mixed oxide charge of the same composition as the melt such that the quantity of melt is maintained substantially stable.

3. A method as claimed in claim 1, wherein said method of growing is a Czochralski crystal growth method.

4. A method as claimed in claim 1, wherein said method of growing is a Stepanov crystal growth method.

5. A method as claimed in claim 4, wherein said Stepanov crystal growth method includes an edge-defined, film-fed (EFG) crystal growth method.

6. A method as claimed in claim 4, wherein said Stepanov crystal growth method includes a capillary action shaping technique (CAST) crystal growth method.

7. A method as claimed in claim 1, wherein a direction of crystal growth is aligned along an axis perpendicular to a crystallographic plane of said crystal having an optimized combination of minimal power flow angle, minimal temperature coefficient of frequency, negligible diffraction and high electromechanical coupling factor.

8. A method as claimed in claim 1, wherein a direction of crystal growth is aligned along an axis perpendicular to a crystallographic plane of said crystal having simultaneously zero power flow angle, zero temperature coefficient of frequency, negligible diffraction, and high electromechanical coupling factor.

9. A method according to claim 1, wherein the piezoelectric lanthanide gallium crystals have a composition represented by the chemical formula

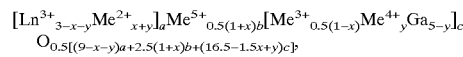

$[Ln^{3+}_{3-x-y}Me^{2+}_{x+y}]_a Me^{5+}_{0.5(1+x)b}[Me^{3+}_{0.5(1-x)}Me^{4+}_y Ga_{5-y}]_c$
$O_{0.5[(9-x-y)a+2.5(1+x)b+(16.5-1.5x+y)c]}$ where $Ln^{3+}$ is at least one of the elements selected from the group consisting of La, Ce, Pr, and Nd; $Me^{2+}$ is at least one of the elements selected from the group consisting of Ca, Sr, Ba, and Pb; $Me^{3+}$ is at least one of the elements selected from the group consisting of Ga, Sc, and In; $Me^{4+}$ is at least one of the elements selected from the group consisting of Si and Ge; $Me^{5+}$ is at least one of the elements selected from the group consisting of Nb, Ta, Sb, and V; x is a value not exceeding one; y is a value not exceeding (2−x); 0.92<a<1.07; 0.9<b<1.1; and 0.99<c<1.02.

10. A method according to claim 9, wherein the lanthanide gallium crystals have a composition represented by the chemical formula

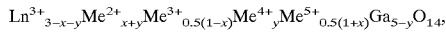

where $Ln^{3+}$ is at least one of the elements selected from the group consisting of La, Ce, Pr, and Nd; $Me^{2+}$ is at least one of the elements selected from the group consisting of Ca, Sr, Ba, and Pb; $Me^{3+}$ is at least one of the elements selected from the group consisting of Ga, Sc, and In; $Me^{4+}$ is at least one of the elements selected from the group consisting of Si and Ge; $Me^{5+}$ is at least one of the elements selected from the group consisting of Nb, Ta, Sb, and V; x is a value not exceeding one; y is a value not exceeding (2−x).

11. A method according to claim 9, wherein the lanthanide gallium crystals have a composition represented by the chemical formula

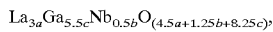

wherein 0.92<a<1.07, 0.9<b<1.1, 0.99<c<1.02.

12. A method according to claim 9, wherein the lanthanide gallium crystals have a composition represented by the chemical formula

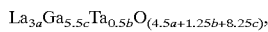

wherein 0.92<a<1.07, 0.9<b<1.1, 0.99<c<1.02.

13. A method according to claim 1, wherein the piezoelectric lanthanide gallium crystals have a composition represented by the chemical formula

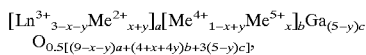

where $Ln^{3+}$ is at least one of the elements selected from the group consisting of La, Ce, Pr, and Nd; $Me^{2+}$ is at least one of the elements selected from the group consisting of Ca, Sr, Ba, and Pb; $Me^{4+}$ is at least one of the elements selected from the group consisting of Ti, Zr, Hf, Sn, Ce, Pr, Si and Ge; $Me^{5+}$ is at least one of the elements selected from the group consisting of Nb, Ta, Sb, and V; x is a value not exceeding one; y is a value not exceeding (2−x); 0.86<a<1.1; 0.85<b<1.3; and 0.94<c<1.08.

14. A method according to claim 13, wherein the lanthanide gallium crystals have a composition represented by the chemical formula

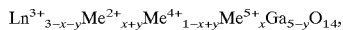

where $Ln^{3+}$ is at least one of the elements selected from the group consisting of La, Ce, Pr, and Nd; $Me^{2+}$ is at least one of the elements selected from the group consisting of Ca, Sr, Ba, and Pb; $Me^{4+}$ is at least one of the elements selected from the group consisting of Ti, Zr, Hf, Ge, Sn, Ce, Pr, Si and Ge; $Me^{5+}$ is at least one of the elements selected from the group consisting of Nb, Ta, Sb, and V; x is a value not exceeding one, y is a value not exceeding (2−x).

15. A method according to claim 13, wherein the lanthanide gallium crystals have a composition represented by the chemical formula

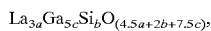

wherein 0.86<a<1.1, 0.85<b<1.3, 0.94<c<1.08.

16. A method according to claim 13, wherein the lanthanide gallium crystals have a composition represented by the chemical formula

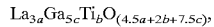

wherein 0.86<a<1.1, 0.85<b<1.3, 0.94<c<1.08.

17. A method according to claim 1, wherein the piezoelectric lanthanide gallium crystals contain vanadium (V) and have a composition represented by the chemical formula

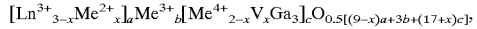

where $Ln^{3+}$ is at least one of the elements selected from the group consisting of La, Ce, Pr, and Nd; $Me^{2+}$ is at least one of the elements selected from the group consisting of Ca, Sr, Ba, and Pb; $Me^{3+}$ is at least one of the elements selected from the group consisting of Ga, Sc, and In; $Me^{4+}$ is at least one of the elements selected from the group consisting of Si, Ge, and Sn; x is a value not exceeding two; 0.86<a<1.1, 0.85<b<1.3, 0.94<c<1.08.

18. A method according to claim 17, wherein the lanthanide gallium crystals contain oxygen vacancies □ of quantity z not, exceeding 0.2 formula units and have a composition represented by the chemical formula

where $Ln^{3+}$ is at least one of the elements selected from the group consisting of La, Ce, Pr, and Nd; $Me^{2+}$ is at least one of the elements selected from the group consisting of Ca, Sr, Ba, and Pb; $Me^{3+}$ is at least one of the elements selected from the group consisting of Ga, Sc, and In; $Me^{4+}$ is at least one of the elements selected from the group consisting of Si, Ge, and Sn; x is a value not exceeding two; 0.86<a<1.1; 0.85<b<1.3; and 0.94<c<1.08.

19. A method according to claim 18, wherein the lanthanide gallium crystals contain oxygen vacancies □ of quantity z not exceeding 0.2 formula units and have a composition represented by the chemical formula

where $Ln^{3+}$ is at least one of the elements selected from the group consisting of La, Ce, Pr, and Nd; $Me^{2+}$ is at least one of the elements selected from the group consisting of Ca, Sr, Ba, and Pb; $Me^{3+}$ is at least one of the elements selected from the group consisting of Ga, Sc, and In; $Me^{4+}$ is at least one of the elements selected from the group consisting of Si, Ge, and Sn; x is a value not exceeding two.

20. A method according to claim 17, wherein the lanthanide gallium crystals have a composition represented by the chemical formula

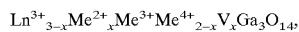

where $Ln^{3+}$ is at least one of the elements selected from the group consisting of La, Ce, Pr, and Nd; $Me^{2+}$ is at least one of the elements selected from the group consisting of Ca, Sr, Ba, and Pb; $Me^{3+}$ is at least one of the elements selected from the group consisting of Ga, Sc, and In; $Me^{4+}$ is at least one of the elements selected from the group consisting of Si, Ge, and Sn; x is a value not exceeding two.

21. A method according to claim 1, wherein the piezoelectric lanthanide gallium crystals contain oxygen vacancies □ of quantity z not exceeding 0.2 formula units and have a composition represented by the chemical formula

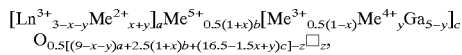

where $Ln^{3+}$ is at least one of the elements selected from the group consisting of La, Ce, Pr, and Nd; $Me^{2+}$ is at least one of the elements selected from the group consisting of Ca, Sr, Ba, and Pb; $Me^{3+}$ is at least one of the elements selected from the group consisting of Ga, Sc, and In; $Me^{4+}$ is at least one of the elements selected from the group consisting of Si and Ge; $Me^{5+}$ is at least one of the elements selected from the group consisting of Nb, Ta, Sb, and V; x is a value not exceeding one, y is a value not exceeding (2−x); 0.92<a<1.07, 0.9<b<1.1, 0.99<c<1.02.

22. A method according to claim 21, wherein the lanthanide gallium crystals contain oxygen vacancies □ of quantity z not exceeding 0.2 formula units and have a composition represented by the chemical formula $$Ln^{3+}_{3-x-y}Me^{2+}_{x+y}Me^{3+}_{0.5(1-x)}Me^{4+}_{y}Me^{5+}_{0.5(1+x)}Ga_{5-y}O_{14-z}\square_z,$$

where $Ln^{3+}$ is at least one of the elements selected from the group consisting of La, Ce, Pr, and Nd; $Me^{2+}$ is at least one of the elements selected from the group consisting of Ca, Sr, Ba, and Pb; $Me^{3+}$ is at least one of the elements selected from the group consisting of Ga, Sc, and In; $Me^{4+}$ is at least one of the elements selected from the group consisting of Si and Ge; $Me^{5+}$ is at least one of the elements selected from the group consisting of Nb, Ta, Sb, and V; x is a value not exceeding one, y is a value not exceeding (2−x).

23. A method according to claim 1, wherein the piezoelectric lanthanide gallium crystals contain oxygen vacancies □ of quantity z not exceeding 0.2 formula units and have a composition represented by the chemical formula $$[Ln^{3+}_{3-x-y}Me^{2+}_{x+y}]_a[Me^{4+}_{1-x+y}Me^{5+}_{x}]_bGa_{(5-y)c}$$
$$O_{0.5[(9-x-y)a+(4+x+4y)b+3(5-y)c]-z}\square_z,$$

where $Ln^{3+}$ is at least one of the elements selected from the group consisting of La, Ce, Pr, and Nd; $Me^{2+}$ is at least one of the elements selected from the group consisting of Ca, Sr, Ba, and Pb; $Me^{4+}$ is at least one of the elements selected from the group consisting of Ti, Zr, Hf, Sn, Ce, Pr, Si and Ge; $Me^{5+}$ is at least one of the elements selected from the group consisting of Nb, Ta, Sb, and V; x is a value not exceeding one, y is a value not exceeding (2−x); 0.86<a<1.1; 0.85<b<1.3; 0.94<c<1.08.

24. A method according to claim 23, wherein the lanthanide gallium crystals contain oxygen vacancies □ of quantity z not exceeding 0.2 formula units and have a composition represented by the chemical formula $$Ln^{3+}_{3-x-y}Me^{2+}_{x+y}Me^{4+}_{1-x+y}Me^{5+}_{x}Ga_{5-y}O_{14-z}\square_z,$$

where $Ln^{3+}$ is at least one of the elements selected from the group consisting of La, Ce, Pr, and Nd; $Me^{2+}$ is at least one of the elements selected from the group consisting of Ca, Sr, Ba, and Pb; $Me^{4+}$ is at least one of the elements selected from the group consisting of Ti, Zr, Hf, Sn, Ce, Pr, Si and Ge; $Me^{5+}$ is at least one of the elements selected from the group consisting of Nb, Ta, Sb, and V; x is a value not exceeding one, y is a value not exceeding (2−x).

25. A method according to claim 1, wherein the piezoelectric lanthanide gallium crystals contain fluorine F of quantity z not exceeding 0.2 formula units and are represented by the chemical formula $$[Ln^{3+}_{3-x-y}Me^{2+}_{x+y}]_a Me^{5+}_{0.5(1+x)b}[Me^{3+}_{0.5(1-x)}Me^{4+}_{y}Ga_{5-y}]_c$$
$$O_{0.5[(9-x-y)a+2.5(1+x)b+(16.5-1.5x+y)c]-0.5z}F_z,$$

where $Ln^{3+}$ is at least one of the elements selected from the group consisting of La, Ce, Pr, and Nd; $Me^{2+}$ is at least one of the elements selected from the group consisting of Ca, Sr, Ba, and Pb; $Me^{3+}$ is at least one of the elements selected from the group consisting of Ga, Sc, and In; $Me^{4+}$ is at least one of the elements selected from the group consisting of Si and Ge; $Me^{5+}$ is at least one of the elements selected from the group consisting of Nb, Ta, Sb, and V; x is a value not exceeding one; y is a value not exceeding (2−x); 0.92<a<1.07; 0.9<b<1.1; and 0.99<c<1.02.

26. A method according to claim 25, wherein the lanthanide gallium crystals contain fluorine of quantity z not exceeding 0.2 formula units and have a composition represented by the chemical formula $$Ln^{3+}_{3-x-y}Me^{2+}_{x+y}Me^{3+}_{0.5(1-x)}Me^{4+}_{y}Me^{5+}_{0.5(1+x)}Ga_{5-y}O_{14-0.5z}F_z$$

where $Ln^{3+}$ is at least one of the elements selected from the group consisting of La, Ce, Pr, and Nd; $Me^{2+}$ is at least one of the elements selected from the group consisting of Ca, Sr, Ba, and Pb; $Me^{3+}$ is at least one of the elements selected from the group consisting of Ga, Sc, and In; $Me^{4+}$ is at least one of the elements selected from the group consisting of Si and Ge; $Me^{5+}$ is at least one of the elements selected from the group consisting of Nb, Ta, Sb, and V; x is a value not exceeding one, y is a value not exceeding (2−x).

27. A method according to claim 1, wherein the piezoelectric lanthanide gallium crystals contain fluorine F of quantity z not exceeding 0.2 formula units and have a composition represented by the chemical formula $$[Ln^{3+}_{3-x-y}Me^{2+}_{x+y}]_a[Me^{4+}_{1-x+y}Me^{5+}_{x}]_bGa_{(5-y)c}$$
$$O_{0.5[(9-x-y)a+(4+x+4y)b+3(5-y)c]-0.5z}F_z,$$

where $Ln^{3+}$ is at least one of the elements selected from the group consisting of La, Ce, Pr, and Nd; $Me^{2+}$ is at least one of the elements selected from the group consisting of Ca, Sr, Ba, and Pb; $Me^{4+}$ is at least one of the elements selected from the group consisting of Ti, Zr, Hf, Sn, Ce, Pr, Si and Ge; $Me^{5+}$ is at least one of the elements selected from the group consisting of Nb, Ta, Sb, and V; x is a value not exceeding one; y is a value not exceeding (2−x); 0.86<a<1.1; 0.85<b<1.3; and 0.94<c<1.08.

28. A method according to claim 27, wherein the lanthanide gallium crystals have a composition represented by the chemical formula $$Ln^{3+}_{3-x-y}Me^{2+}_{x+y}Me^{4+}_{1-x+y}Me^{5+}_{x}Ga_{5-y}O_{14-0.5z}F_z$$

where $Ln^{3+}$ is at least one of the elements selected from the group consisting of La, Ce, Pr, and Nd; $Me^{2+}$ is at least one of the elements selected from the group consisting of Ca, Sr, Ba, and Pb; $Me^{4+}$ is at least one of the elements selected from the group consisting of Ti, Zr, Hf, Ge, Sn, Ce, Pr, Si and Ge; $Me^{5+}$ is at least one of the elements selected from the group consisting of Nb, Ta, Sb, and V; x is a value not exceeding one, y is a value not exceeding (2−x) and z<0.2.

29. A method according to claim 1, wherein the piezoelectric lanthanide gallium crystals contain fluorine F of quantity z not exceeding 0.2 formula units and have a composition represented by the chemical formula $$[Ln^{3+}_{3-x}Me^{2+}_{x}]_a Me^{3+}_{b}[Me^{4+}_{2-x}V_{x}Ga_{3}]_c O_{0.5[(9-x)a+3b+(17+x)c]-0.5z}F_z,$$

where $Ln^{3+}$ is at least one of the elements selected from the group consisting of La, Ce, Pr, and Nd; $Me^{2+}$ is at least one of the elements selected from the group consisting of Ca, Sr, Ba, and Pb; $Me^{3+}$ is at least one of the elements selected from the group consisting of Ga, Sc, and In; $Me^{4+}$ is at least one of the elements selected from the group consisting of Si, Ge, and Sn; x is a value not exceeding two; 0.86<a<1.1; 0.85<b<1.3; and 0.94<c<1.08.

30. A method according to claim 29, wherein the lanthanide gallium crystals contain a fluorine F of quantity of quantity z not exceeding 0.2 formula units and have a composition represented by the chemical formula

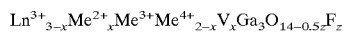

where $Ln^{3+}$ is at least one of the elements selected from the group consisting of La, Ce, Pr, and Nd; $Me^{2+}$ is at least one of the elements selected from the group consisting of Ca, Sr, Ba, and Pb; $Me^{3+}$ is at least one of the elements selected from the group consisting of Ga, Sc, and In; $Me^{4+}$ is at least one of the elements selected from the group consisting of Si, Ge, and Sn; x is a value not exceeding two.

31. A method as claimed in claim 1, wherein the lanthanum gallium melt is doped with the micro additions of chemical elements selected from the group consisting of Li, Be, B, Na, Mg, Al, P, K, Ca, Sc, Ti, V, Cr, Mn, Fe, Co, Ni, Cu, Zn, Ge, As, Se, Rb, Sr, Y, Mo, Ru, Rh, Pd, Ag, Cd, In, Sn, Sb, Cs, Ba, Ce, Sm, Eu, Gd, Tb, Dy, Ho, Er, Tm, Yb, Lu, Hf, Ta, W, Re, Os, Ir, Pt, Au, Hg, Tl, Pb, Bi, U, and Th at the quantity from $1 \times 10^{17}$ atom/cm$^3$ to $5 \times 10^{19}$ atom/cm$^3$.

* * * * *

UNITED STATES PATENT AND TRADEMARK OFFICE
CERTIFICATE OF CORRECTION

PATENT NO.     : 6,514,336 B1
DATED          : February 4, 2003
INVENTOR(S)    : Iouri D. Zavartsev et al.

It is certified that error appears in the above-identified patent and that said Letters Patent is hereby corrected as shown below:

Column 4,
Line 35, delete "a", and insert -- $\alpha$ --.

Column 7,
Line 67, delete "C./hour", and insert -- C/hour --.

Column 8,
Lines 27 and 54, delete "C./hour" and insert -- C/hour --.

Column 9,
Lines 16 and 46, delete "C./hour" and insert -- C/hour --.

Column 10,
Line 7, delete "C./hour", and insert -- C/hour --.

Signed and Sealed this

Ninth Day of September, 2003

JAMES E. ROGAN
*Director of the United States Patent and Trademark Office*